(12) United States Patent
Manipatruni et al.

(10) Patent No.: US 11,127,785 B2
(45) Date of Patent: Sep. 21, 2021

(54) CROSS-POINT MAGNETIC RANDOM ACCESS MEMORY WITH PIEZOELECTRIC SELECTOR

(71) Applicant: Intel Corporation, Santa Clara, CA (US)

(72) Inventors: Sasikanth Manipatruni, Hillsboro, OR (US); Dmitri E. Nikonov, Beaverton, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 353 days.

(21) Appl. No.: 16/305,370

(22) PCT Filed: Jun. 28, 2016

(86) PCT No.: PCT/US2016/039897
§ 371 (c)(1),
(2) Date: Nov. 28, 2018

(87) PCT Pub. No.: WO2018/004548
PCT Pub. Date: Jan. 4, 2018

(65) Prior Publication Data
US 2020/0321393 A1 Oct. 8, 2020

(51) Int. Cl.
| | |
|---|---|
| *H01L 27/22* | (2006.01) |
| *H01L 43/02* | (2006.01) |
| *H01L 43/10* | (2006.01) |
| *H01L 43/12* | (2006.01) |

(52) U.S. Cl.
CPC ............ *H01L 27/224* (2013.01); *H01L 43/02* (2013.01); *H01L 43/10* (2013.01); *H01L 43/12* (2013.01)

(58) Field of Classification Search
CPC ....... H01L 27/224; H01L 43/02; H01L 43/10; H01L 27/22
See application file for complete search history.

(56) References Cited

U.S. PATENT DOCUMENTS

| | | |
|---|---|---|
| 8,576,615 B2 | 11/2013 | Baraji et al. |
| 2006/0133137 A1 | 6/2006 | Shin et al. |
| 2008/0049488 A1 | 2/2008 | Rizzo |
| 2010/0080048 A1 | 4/2010 | Liu |
| 2014/0269035 A1 | 9/2014 | Manipatruni et al. |

OTHER PUBLICATIONS

International search Report and Written Opinion for International Patent Application No. PCT/US2016/039897, dated Mar. 27, 2017.
International Preliminary Report on Patentability from PCT/US2016/039897 notified Jan. 10, 2019, 12 pgs.

*Primary Examiner* — Errol V Fernandes
(74) *Attorney, Agent, or Firm* — Finch & Maloney PLLC

(57) ABSTRACT

A three dimensional (3D) array of magnetic random access memory (MRAM) bit-cells is described, wherein the array includes a mesh of: a first interconnect extending along a first axis; a second interconnect extending along a second axis; and a third interconnect extending along a third axis, wherein the first, second and third axes are orthogonal to one another, and wherein a bit-cell of the MRAM bit-cells includes: a magnetic junction device including a first electrode coupled to the first interconnect; a piezoelectric (PZe) layer adjacent to a second electrode, wherein the second electrode is coupled to the second interconnect; and a first layer adjacent to the PZe layer and the magnetic junction, wherein the first layer is coupled the third interconnect.

23 Claims, 10 Drawing Sheets

CROSS-POINT MAGNETIC RANDOM ACCESS MEMORY WITH PIEZOELECTRIC SELECTOR

CLAIM OF PRIORITY

This Application is a National Stage Entry of, and claims priority to, PCT Application No. PCT/US2016/039897, filed on Jun. 28, 2016 and titled "CROSS-POINT MAGNETIC RANDOM ACCESS MEMORY WITH PIEZOELECTRIC SELECTOR", which is incorporated by reference in its entirety for all purposes.

BACKGROUND

Embedded memory with state retention can enable energy and computational efficiency. However, leading spintronic memory options, for example, spin transfer torque (STT) based magnetic random access memory (STT-MRAM), suffer from the problem of high voltage and high write current during the programming (e.g., writing) of a bit-cell. For instance, large write current (e.g., greater than 100 μA) and voltage (e.g., greater than 0.7 V) are required to write a tunnel junction based magnetic tunnel junction (MTJ). Limited write current also leads to high write error rates or slow switching times (e.g., exceeding 20 ns) in MTJ based MRAM. The presence of a tunneling path leads to reliability issues in magnetic tunnel junctions.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
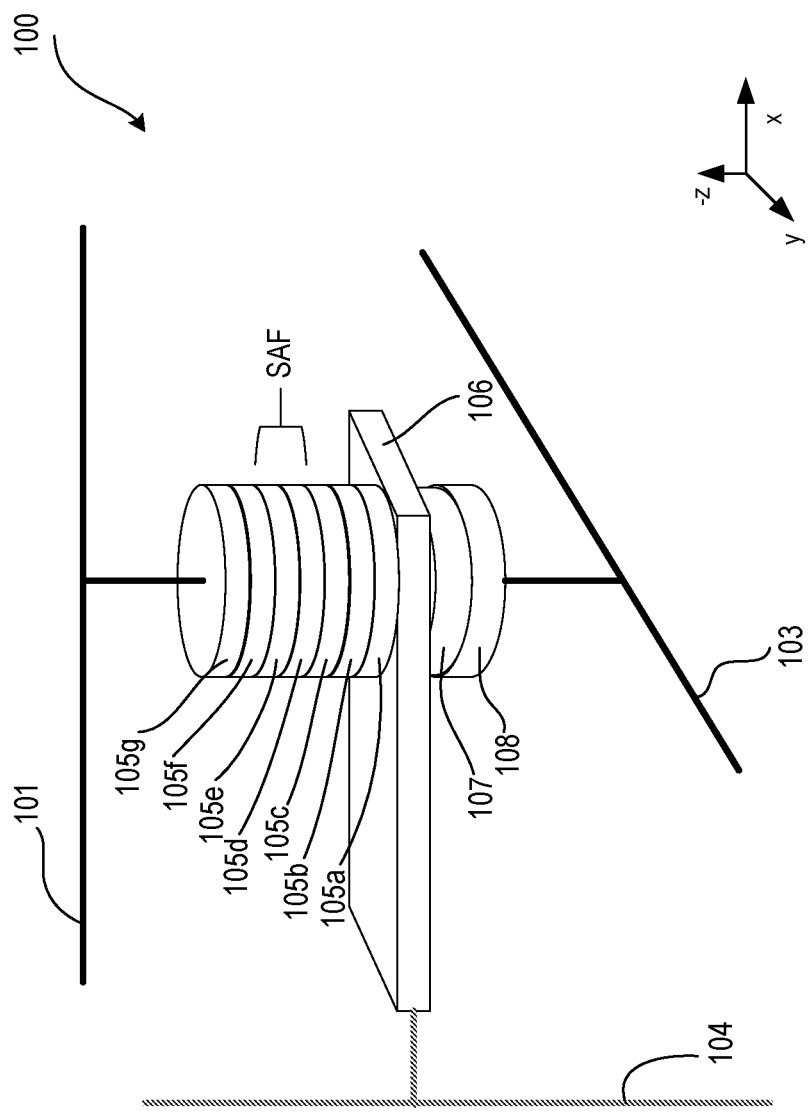
FIG. 1 illustrates a three-dimensional (3D) cross-point Magnetic Random Access Memory (MRAM) bit-cell with Piezoelectric (PZe) Selector, in accordance with some embodiments of the disclosure.

On-chip embedded memory with non-volatility can enable energy and computational efficiency. In some embodiments, cross-point MRAM is enabled with mechanisms for bit-cell selectivity, and mechanisms to reduce the drive current requirement (e.g., for reducing the selector current needs as well as for reducing the heat dissipation from a three dimensional (3D) bulk).

Various embodiments enable cross-point MRAM by using a piezoelectric (PZe) selector which selectively reduces the write current of the MRAM. In some embodiments, the PZe selector reduces the switching drive current by lowering the effective switching barrier using a strain assisted mechanism. In some embodiments, a voltage driven capacitive stimulus is used to excite a PZe layer producing strain in a magnetic recording layer (e.g., free layer of the magnetic tunnel junction). In some embodiments, the PZe layer is selected by a cross-point mechanism which allows two dimensional (2D) and 3D selectivity. In some embodiments, the strain provided by the PZe layer, coupled to the magnet, produces a magnetostrictive lowering of the magnet thermal barrier by reducing the thermal barrier of the magnet. In some embodiments, a spin torque current is provided with the appropriate polarity to switch the memory bit-cell to 0° or 180° based on the programming voltages.

The cross-point MRAM of various embodiments allows for significantly smaller write current (e.g., less than 20 μA compared to 100 μA for nominal write) through the MTJ, and provides lower power dissipation (and hence lower thermal dissipation) for extracting heat from the bulk of the cross-point MRAM. Smaller write current also improves reliability of the tunneling oxide in magnetic junctions. Another technical effect of smaller write current is improved switching energy since the transduction is capacitive with a current assist. The cross-point MRAM of the various embodiments performs better than 1T-1R MTJ (e.g., one transistor, one resistive memory based bit-cell) in that the total capacity of the memory chip is not limited by frontend area, and power dissipation density of the memory is lowered per unit volume allowing easier heat extraction. Here, frontend area refers to lower level transistor layers (e.g., layers below metal zero (M0)). Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct physical, electrical, or wireless connection between the things that are connected, without any intermediary devices. The term "coupled" means either a direct electrical or wireless connection between the things that are connected or an indirect electrical or wireless connection through one or more passive or active intermediary devices. The term "circuit" means one or more passive and/or active components that are arranged to cooperate with one another to provide a desired function. The term "signal" means at least one current signal, voltage signal, magnetic signal, electromagnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

FIG. 1 illustrates a 3D cross-point MRAM bit-cell 100 with PZe Selector, in accordance with some embodiments of the disclosure. In some embodiments, bit-cell 100 is a three terminal device, where a first terminal is coupled to a first interconnect 101, a second terminal is coupled to second interconnect 103, and a third terminal is coupled to third interconnect 104. In some embodiments, first interconnect 101 extends along a first axis (e.g., x-axis), second interconnect 103 extends along a second axis (e.g., y-axis), and third interconnect 104 extends along a third axis (e.g., z-axis), where the first, second and third axes are orthogonal to one another.

In some embodiments, bit-cell 100 comprises a magnetic junction device including a first electrode (or terminal) coupled to first interconnect 101. In some embodiments, bit-cell 100 comprises a PZe layer (or selector layer) 107 adjacent to a second electrode (or terminal), wherein the second electrode is coupled to second interconnect 103. In some embodiments, bit-cell 100 comprises a first layer 106 adjacent to PZe layer 107 and the magnetic junction, wherein first layer 106 is coupled to third interconnect 104.

In some embodiments, the magnetic junction device is one of spin valve or magnetic tunneling junction (MTJ). In some embodiments, the magnetic junction device comprises: a free magnetic layer 105a; a fixed magnetic layer 105c; and an intermediate layer 105b adjacent to the free and fixed magnetic layers 105a and 105c, respectively. In some embodiments, intermediate layer 105b is a metal layer which makes the magnetic junction a spin valve. In some embodiments, intermediate layer 105b is a dielectric layer (e.g., MgO), which makes the magnetic junction an MTJ.

In some embodiments, the free and fixed magnetic layers (105a and 105c, respectively) are formed of CFGG (i.e., Cobalt (Co), Iron (Fe), Germanium (Ge), or Gallium (Ga) or a combination of them). In some embodiments, the free and fixed magnetic layers (105a and 105c, respectively) are formed of materials selected from a group consisting of: Fe, Ni, Co and their alloys, magnetic insulators, and Heusler alloys of the form $X_2YZ$. Heusler alloys are ferromagnetic metal alloys based on a Heusler phase. Heusler phases are intermetallic with certain composition and face-centered cubic crystal structure. The ferromagnetic property of the Heusler alloys are a result of a double-exchange mechanism between neighboring magnetic ions.

In some embodiments, Heusler alloys are selected from a group consisting of: $Co_2FeAl$ and $Co_2FeGeGa$. Other examples of Heusler alloys include: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Fe_2VAl$, $Mn_2VGa$, and $Co_2FeGe$.

In some embodiments, the free and fixed magnetic layers (105a and 105c, respectively) are in-plane magnets. For example, the direction of magnetizations are along the plane of the magnet (e.g., x-axis). In one case, the magnetization direction of the fixed magnetic layer 105c is perpendicular relative to the magnetization direction of the free magnetic layer 105a (e.g., magnetization directions of the free and fixed magnetic layers are not parallel, rather they are orthogonal). For example, magnetization direction of the free magnetic layer 105a is in-plane while the magnetization direction of the fixed magnetic layer 105c is perpendicular to the in-plane. In another case, magnetization direction of the fixed magnetic layer 105c is in-plane while the magnetization direction of the free magnetic layer 105a is perpendicular to the in-plane.

The thickness of a ferromagnetic layer (i.e., free or fixed magnetic layer) may determine its equilibrium magnetization direction. For example, when the thickness of the ferromagnetic layer 105a/c is above a certain threshold (depending on the material of the magnet, e.g. approximately 1.5 nm for CoFe), then the ferromagnetic layer exhibits magnetization direction which is in-plane. Likewise, when the thickness of the ferromagnetic layer 105a/c is below a certain threshold (depending on the material of the magnet), then the ferromagnetic layer 105a/c exhibits magnetization direction which is perpendicular to the plane of the magnetic layer.

Other factors may also determine the direction of magnetization. For example, factors such as surface anisotropy (depending on the adjacent layers or a multi-layer composition of the ferromagnetic layer) and/or crystalline anisotropy (depending on stress and the crystal lattice structure modification such as FCC (face centered cubic lattice), BCC (body centered cubic lattice), or $L1_0$-type of crystals, where $L1_0$ is a type of crystal class which exhibits perpendicular magnetizations), can also determine the direction of magnetization. $L1_0$ is a crystallographic derivative structure of a FCC structure and has two of the faces occupied by one type of atom and the corner and the other face occupied with the second type of atom. When phases with the $L1_0$ structure are ferromagnetic the magnetization vector usually is along the [0 0 1] axis of the crystal. Examples of materials with $L1_0$ symmetry include CoPt and FePt.

In some embodiments, the magnetic junction further includes layers 105d, 105e, 105f, and 105g. In some embodiments, layer 105d is formed of Ru. In some embodiments, layer 105e is formed of $Co_xFe_yB_z$, where 'x,' 'y,' and 'z' are fractions of elements in the alloys. In some embodiments, layer 105f is formed of IrMn. In some embodiments, layer 105g is a metal layer (e.g., Cu) forming an electrode. In some embodiments, fixed magnetic layer is formed of a collection of layers 105c/d/e which is a combination of CoFe, Ru, and CoFe layers, respectively, referred to as Synthetic Anti-Ferromagnet (SAF). In some embodiments, SAF (or SAF layer) is adjacent to free magnetic layer 105a via layer 105b (e.g., MgO or metal). In some embodiments, layer 105f is an Anti-Ferromagnet (AFM) layer which is adjacent to the SAF layer, and also coupled to the first electrode. The SAF has the property, that the magnetizations in the two CoFe layers are opposite, and allows for cancelling the dipole fields around the free magnetic layer such that a stray dipole field will not control free magnetic layer 105a.

In some embodiments, free magnetic layer 105a has perpendicular magnetic anisotropy (PMA), and fixed magnetic layer 105c is an in-plane magnet. In some embodiments, the free perpendicular magnet layer 105a of the magnetic junction (e.g., spin valve or MTJ) is formed of a stack of materials, wherein the materials for the stack are selected from a group consisting of: Co and Pt; Co and Pd; Co and Ni; MgO, CoFeB, Ta, CoFeB, and MgO; MgO, CoFeB, W, CoFeB, and MgO; MgO, CoFeB, V, CoFeB, and MgO; MgO, CoFeB, Mo, CoFeB, and MgO; $Mn_xGa_y$; Materials with $L1_0$ symmetry; and materials with tetragonal crystal structure. Examples of materials with tetragonal crystal structure and magnetic moment are Heusler alloys such as CoFeAl, MnGe, MnGeGa, and MnGa. In some embodiments, free magnet layer 105a of the magnetic junction (e.g., spin valve or MTJ) is formed of a single layer of one or more materials. In some embodiments, the single layer is formed of a material selected from a group consisting of: MnGa, MnGe, and MnGaGe.

In some embodiments, fixed perpendicular magnet layer 105c is formed with interfacial PMA, multi-interface PMA, magnetic crystalline anisotropy or multi-layer PMA. In some embodiments, the free perpendicular magnet layer 105a is formed with interfacial PMA, multi-interface PMA, magnetic crystalline anisotropy or multi-layer PMA. In some embodiments, Tunneling Magneto Resistance (TMR) is used for memory readout from PMA-MTJ. In some embodiments, the magnet with PMA is formed of a stack of materials, where the materials for the stack are selected from a group consisting of: Co and Pt; Co and Pd; Co and Ni; MgO, CoFeB, Ta, CoFeB, and MgO; MgO, CoFeB, W, CoFeB, and MgO; MgO, CoFeB, V, CoFeB, and MgO; MgO, CoFeB, Mo, CoFeB, and MgO; $Mn_xGa_y$; Materials with $L1_0$ symmetry; and materials with tetragonal crystal structure. In some embodiments, the magnet with PMA is formed of a single layer of one or more materials. In some embodiments, the single layer is formed of MnGa. Here, perpendicularly magnetized free magnet refers to a magnet having magnetization which is perpendicular to the plane of the magnet as opposed to in-plane magnet that has magnetization in a direction along the plane of the magnet.

In some embodiments, the perpendicular magnets of free layer 105a of the magnetic junction (e.g., spin valve or MTJ) are formed with a sufficiently high anisotropy (indicated by an effective anisotropy magnetic field $H_k$) and sufficiently low saturated magnetization ($M_s$) to increase injection of spin currents. Saturated magnetization $M_s$ is generally the state reached when an increase in applied external magnetic field H cannot increase the magnetization of the material. Here, sufficiently low $M_s$ refers to $M_s$ less than 200 kA/m (kilo-Amperes per meter). Anisotropy $H_k$ generally refers to the material property which is directionally dependent. Materials with high $H_k$ are materials with material properties that are highly directionally dependent. Here, sufficiently high $H_k$ in context of Heusler alloys is considered to be greater than 2000 Oe (Oersted).

In some embodiments, bit-cell 100 comprises layer 106 which is adjacent to free magnet layer 105a. In some embodiments, layer 106 is formed of a material selected from a group consisting of: Ru, Ta, and W. The thickness of layer 106 is in the range of 5 nm to 10 nm, in accordance with some embodiments. For example, Ru of layer 106 is 5-10 nm thick. In some embodiments, layer 106 forms a terminal of bit-cell 100 and is coupled to third interconnect 104. In some embodiments, layer 106 is used to apply bias to a selector layer 107.

In some embodiments, bit-cell 100 comprises a selector layer 107 adjacent to layer 106. In some embodiments, selector layer 107 is a PZe layer (also referred to as PZe selector). In some embodiments, PZe selector 107 selectively reduces the write current of bit-cell 100. In some embodiments, PZe selector 107 reduces the switching drive current by lowering the effective switching barrier using a strain assisted mechanism. PZe layer 107 causes piezoelectric effect in FM 105a when a voltage is applied to PZe layer 107. The applied voltage across PZe layer 107 causes change in the magnetic field in FM 105a and so it stresses FM 105a. The stress in turn causes free magnet layer 105a to have a lower energy barrier. In some embodiments, PZe selector 107 reduces the switching drive current by lowering the effective switching barrier using a strain assisted mechanism. In some embodiments, a voltage driven capacitive stimulus is used to excite PZe layer 107 producing strain in a magnetic recording layer (e.g., free layer 105a of the magnetic tunnel junction). In some embodiments, PZe layer 107 is selected by a cross-point mechanism which allows 2D and 3D selectivity. In some embodiments, the strain provided by PZe layer 107, coupled to free magnet 105a via layer 106, produces a magnetostrictive lowering of the magnet thermal barrier by reducing the thermal barrier of free magnet 105a.

In some embodiments, PZe layer 107 is formed of a material selected from a group consisting of: Barium titanate ($BaTiO_3$), Lead zirconate titanate (PZT), Potassium niobate ($KNbO_3$), Sodium tungstate ($Na_2WO_3$), $Ba_2NaNb_5O_5$, $Pb_2KNb_5O_{15}$, Zinc oxide (ZnO)-Wurtzite structure, Sodium potassium niobate (($KNa)NbO_3$) (or NKN), Bismuth ferrite ($BiFeO_3$), Sodium niobate $NaNbO_3$, Bismuth titanate $Bi_4Ti_3O_{12}$, Sodium bismuth titanate $Na_{0.5}Bi_{0.5}TiO_3$, any bulk or nanostructured semiconductor crystal having non central symmetry, such as the Group III-V and II-VI materials, Polyvinylidene fluoride (PVDF), and diphenylalanine peptide nanotubes (PNTs). In some embodiments, PZe layer 107 is about 20 nm to 40 nm thick.

In some embodiments, bit-cell 100 comprises layer 108 which is a non-magnetic layer providing a function of an electrode. In some embodiments, layer 108 is formed of Cu or any other non-magnetic conductor. In some embodiments, layer 108 is coupled to second interconnect 103. In some embodiments, the first, second, and third interconnects (101, 103, and 104, respectively) are formed of non-magnetic metals (e.g., Cu, Au, or Al, etc.).

Figure 2B:
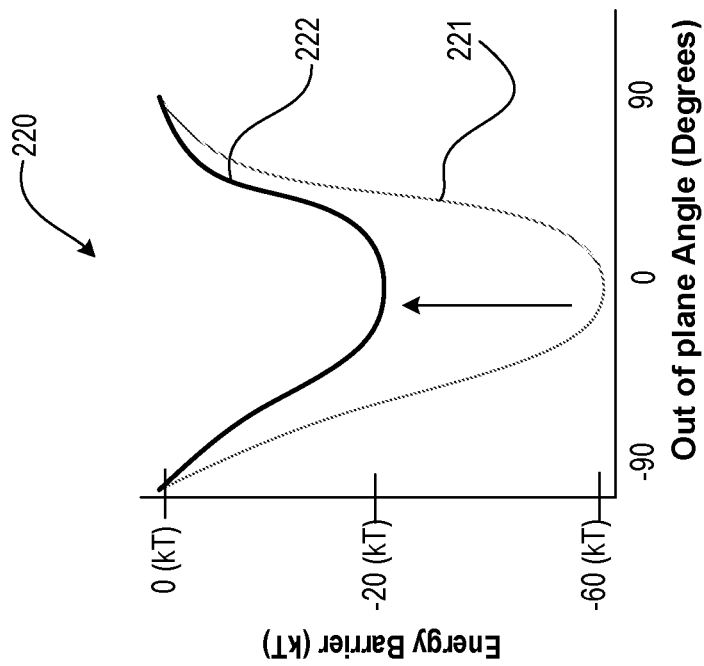
FIG. 2B illustrates a plot showing change in energy barrier when the 3D cross-point MRAM bit-cell operates in write mode, according to some embodiments of the disclosure.
Figure 2A:
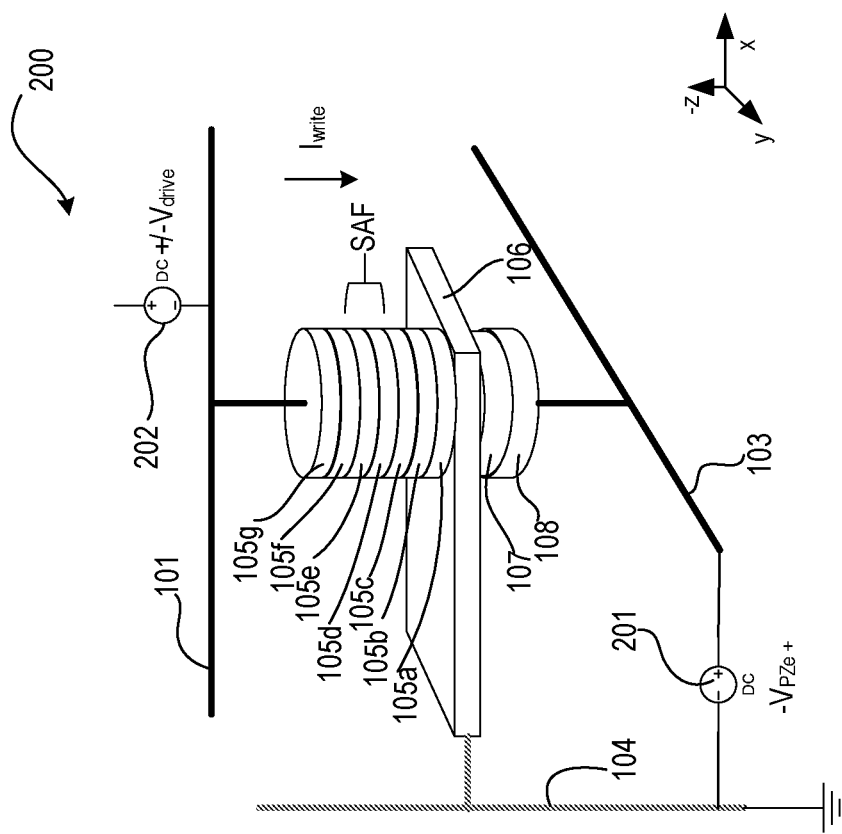
FIG. 2A illustrates a 3D cross-point MRAM bit-cell operating in write mode, according to some embodiments of the disclosure.

FIG. 2A illustrates a 3D cross-point MRAM bit-cell 200 operating in write mode, according to some embodiments of the disclosure. It is pointed out that those elements of FIG. 2A having the same reference numbers (or names) as the elements of any other figure can operate or function in any manner similar to that described, but are not limited to such. In some embodiments, during write operation, voltage $V_{PZe}$ is applied across interconnects 103 and 104. The applied voltage is illustrated with a DC battery source 201. For example, second interconnect 103 is applied $V_{PZe}$, while third interconnect 104 is applied ground. In some embodiments, write current $I_{write}$ is then passed through the stacks of layers of the magnetic junction via first interconnect 101. The write current $I_{write}$ is a spin torque current which is applied in the x-z direction (e.g., by applied $V_{drive}$ 202 to first interconnect 101 and ground to third interconnect 104), and this write current sets magnetization of free layer 105a. Depending on the direction of magnetization of free layer 105a, data 0 or data 1 is stored in bit-cell 200.

FIG. 2B illustrates plot 220 showing change in energy barrier when the 3D cross-point MRAM bit-cell 200 operates in write mode, according to some embodiments of the disclosure. It is pointed out that those elements of FIG. 2B having the same reference numbers (or names) as the elements of any other figure can operate or function in any manner similar to that described, but are not limited to such. For plot 220, the x-axis is out-of-plane angle in degrees, and the y-axis is Energy in kT. Plot 220 illustrates two waveforms—221 and 222. Here, waveform 221 illustrates the thermal barrier of free magnet layer 105a when no voltage is applied across PZe layer 107. In this example, the thermal barrier of free magnet layer 105a is −60 kT. Upon application of voltage $V_{PZe}$ across PZe layer 107, the thermal barrier of free magnet layer 105a drops (e.g., to −20 kT), which allows for writing to bit-cell 100/200 with much lower current than otherwise. This reduction in the thermal barrier is illustrated by waveform 222.

Figure 3B:
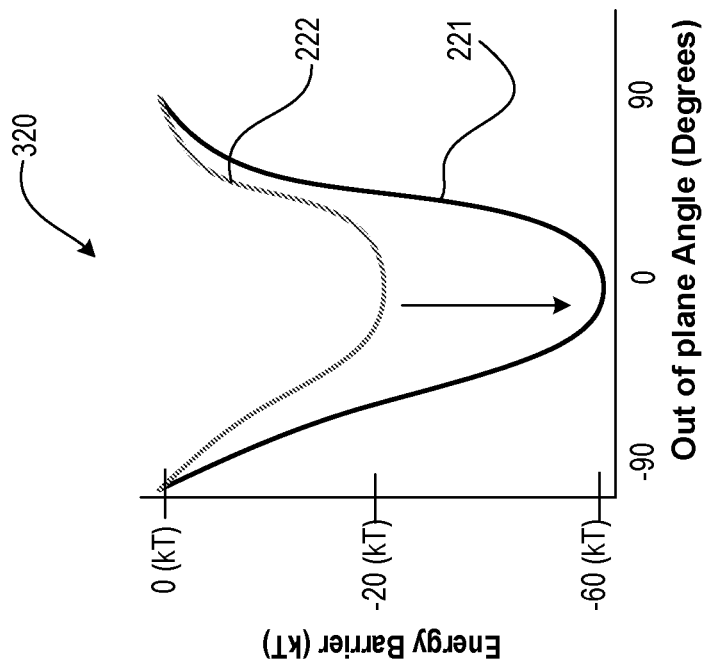
FIG. 3B illustrates a plot showing change in energy barrier when the 3D cross-point MRAM bit-cell operates in read mode, according to some embodiments of the disclosure.
Figure 3A:
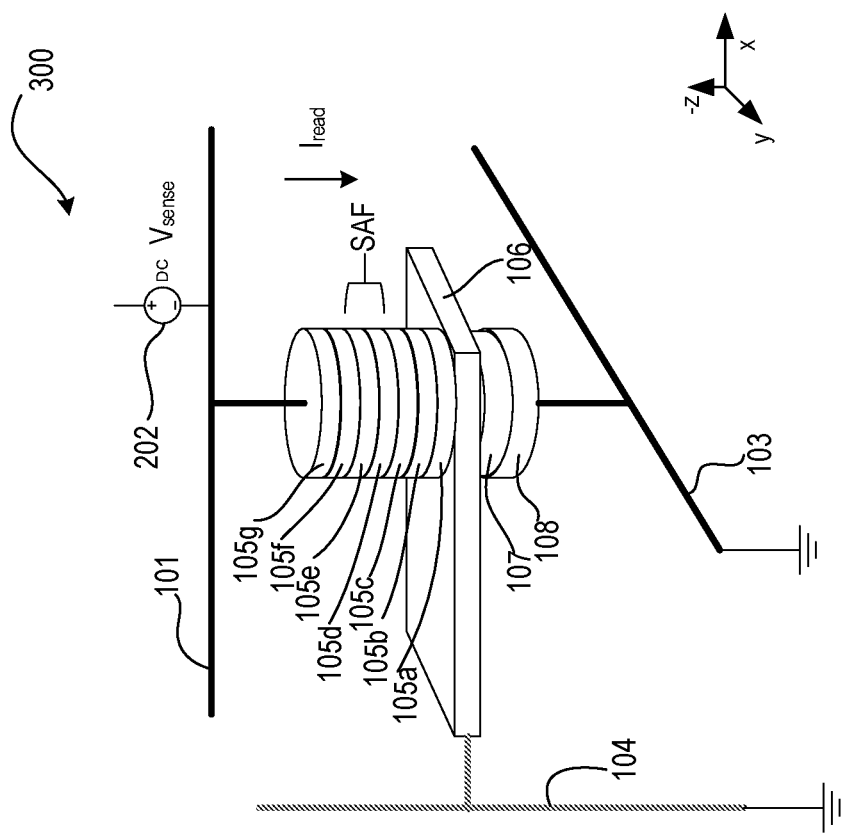
FIG. 3A illustrates a 3D cross-point MRAM bit-cell operating in read mode, according to some embodiments of the disclosure.

FIG. 3A illustrates a 3D cross-point MRAM bit-cell 300 operating in read mode, according to some embodiments of the disclosure. It is pointed out that those elements of FIG. 3A having the same reference numbers (or names) as the elements of any other figure can operate or function in any manner similar to that described, but are not limited to such. In some embodiments, during read operation, no voltage is applied across interconnects 103 and 104. In some embodiments, during read operation, if any voltage $V_{PZe}$ is applied across interconnects 103 and 104 (i.e., across PZe layer 107), then that voltage is less than the PZe threshold and the barrier is maintained at a high voltage. In some embodiments, TMR is used to sense the read current $I_{read}$. The sensing of the read current is illustrated by source $V_{sense}$. In some embodiments, when the directions of magnetization of free magnet layer 105a and fixed magnet layer 105c are parallel, then magnetic junction exhibits low resistance. Sensing of low resistance may refer to reading data 0, for example. In some embodiments, when the directions of magnetization of free magnet layer 105a and fixed magnet layer 105c are anti-parallel, then magnetic junction exhibits high resistance. Sensing of high resistance may refer to reading data 1, for example.

FIG. 3B illustrates plot 320 showing change in energy barrier when the 3D cross-point MRAM bit-cell 300 operates in read mode, according to some embodiments of the disclosure. Compared to plot 220, here when no voltage or voltage below PZe threshold of PZe layer 107 is applied, the thermal barrier of free magnet layer 105a reverts back to its higher barrier state as illustrated by waveform 221. For example, during read mode, the thermal barrier of layer 105a reverts back to −60 kT from −20 kT.

Figure 4:
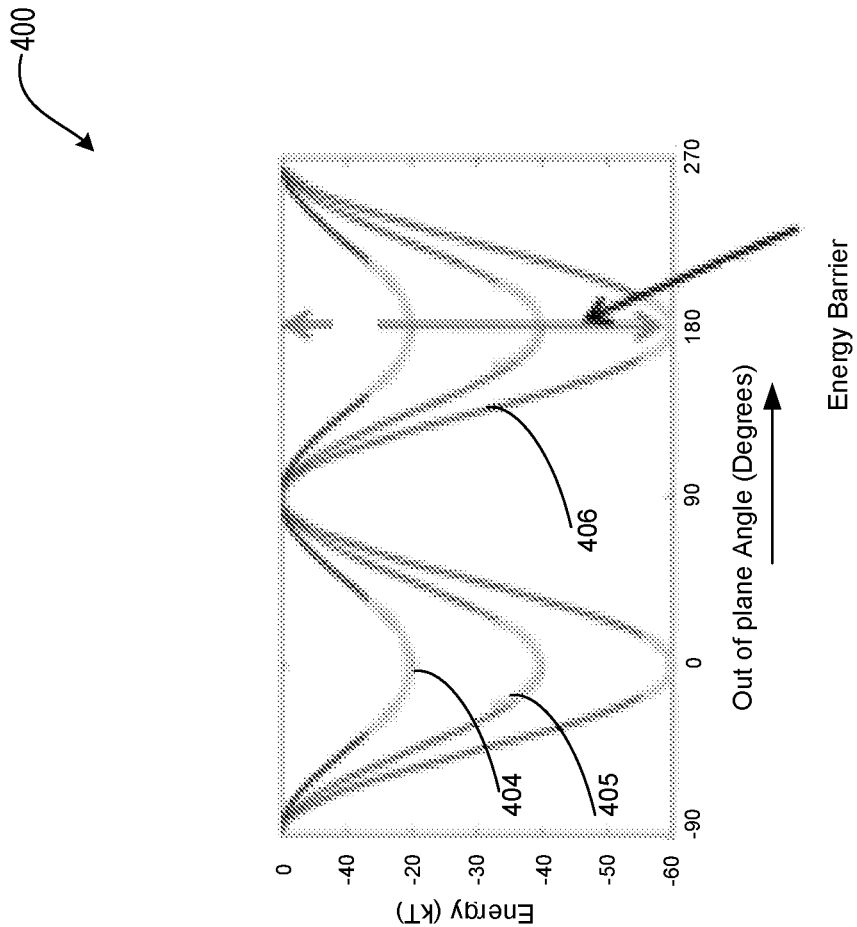
FIG. 4 illustrates a PZe Selector, and its operating principle, according to some embodiments of the disclosure.
Figure 4:
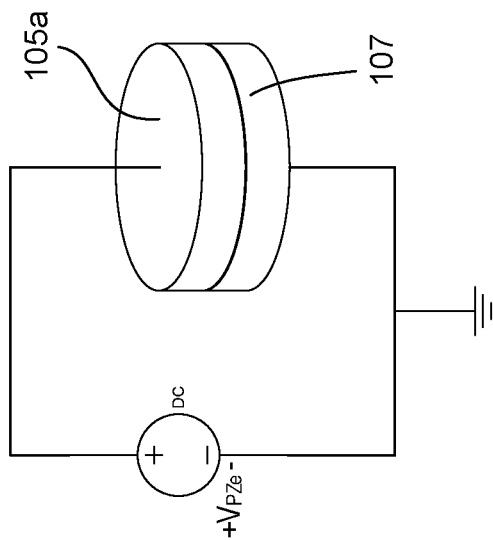

FIG. 4 illustrates PZe Selector 400, and its operating principle, according to some embodiments of the disclosure. It is pointed out that those elements of FIG. 4 having the same reference numbers (or names) as the elements of any other figure can operate or function in any manner similar to that described, but are not limited to such. For sake of illustrating the strain applied by PZe layer 107, other layers are removed and layers 107 and 105a are shown being adjacent to one another. The plot to the right illustrates thermal energy barrier plot where the x-axis is out-of-plane angle in degrees, and the y-axis is Energy in kT. The plot illustrates three sets of waveforms—404, 405, and 406. Here, waveform 404 illustrates a thermal barrier of free magnet layer 105a being −20 kT (e.g., when voltage is applied across PZe layer 107), waveform 405 illustrates a thermal barrier of free magnet layer 105a being −40 kT, and waveform 406 illustrates a thermal barrier of free magnet layer 105a being −60 kT (e.g., when no voltage is applied across PZe layer 107).

The operating principle of the PZe selector is the lowering of the magnetic anisotropy to strain (magnetostriction) observed in certain magnetic materials. Magnetization reversal due to spin torque is governed by Landau-Lifshitz-Gilbert equation. STT (Spin Transfer Torque) switching requires a critical spin torque current for switching, which precesses the magnetization from its initial easy axis direction and rolls it over the energy barrier along the hard axis overcoming the Gilbert damping effect, thereby switching the direction of magnetization by 180° with respect to its initial direction. The value of the critical spin torque current depends on the effective magnetic barrier to be overcome by spin torque. The application of $V_{PZe}$ across PZe layer 107 is an effective mechanism to lower the magnetic barrier for spin torque switching by magnetostrictive pre-switching which switches magnet 105a at a much lower barrier for magnetic switching.

The following section describes the fabrication of a portion of bit-cell 100, in accordance with some embodiments of the disclosure. In some embodiments, a hybrid piezoelectric-ferromagnetic hetero-structure (comprising of Ferromagnet/Ta/PZT) is used as a starting point. In some embodiments, a tetragonal mono-domain ferroelectric, $Pb(Zr_{0.2}Ti_{0.8})O_3$ (PZT) film is grown on a conducting bottom electrode 108 as piezoelectric layer 107 on top of which layer 106 of Ru followed by free nanomagnet 105a is lithographically patterned. The application of voltage between free nanomagnet 105a and bottom electrode 108 generates an in-plane bi-axial strain in PZe layer 107, which is transferred to magnet 105a. In some embodiments, the stack of layers forming bit-cell 100 is an inverted stack that allows for an etch top on the strain mediating conducting layer 106. Here, PZe layer 107 is also referred to as PZT layer 107, where PZT is lead zirconate titanate.

For PZT film (an example of PZe) with (xyz=001) surface orientation (ferroelectric polarization along the ±z-axis), the bi-axial strain is equal in magnitude and sign along the in-plane crystallographic directions, (xyz=010) and (xyz=100). The strain components along the <xyz=010> and (xyz=100) directions are given by:

$$\varepsilon_{xx} = \varepsilon_{yy} = d_{31} E_z$$

where, $d_{31}$ is the piezoelectric coefficient of the PZT layer 107. On the other hand, for PZT with (xyz=110) surface orientation, the application of an out-of-plane electric field creates two different strains along the two in-plane crystallographic directions, (xyz=001) and (xyz=101). In such a case, it can be shown that the strain components along the (xyz=001) and (xyz=101) directions are given by:

$$\varepsilon_{xx} = (d_{31} + d_{33})\frac{E_z}{2\sqrt{2}}$$

$$\varepsilon_{yy} = d_{31}\frac{E_z}{\sqrt{2}}$$

The aforementioned difference in the strain distribution results in a difference in the magnetization dynamics of the nanomagnets on PZT film 107 with (xyz=001) and (xyz=110) surface orientation.

The following section describes the analysis of the response of nanomagnet 105a to a stress pulse. In the presence of a bi-axial stress, the magnetic anisotropy of the nanomagnet changes due to the inverse magnetostriction effect. The energy contribution due to the stresses, $\{\sigma_i\}$, (i≡xx, yy) making angles, $\{\delta_i\}$ with the unit vector along the direction of the magnetization is given by:

$$E_{strain} = \frac{3}{2}\lambda \sum_i \sigma_i \text{Cos}^2 \delta_i$$

where, $\lambda$ is the magnetostrictive coefficient of the magnetic material. In this example, $Co_{0.6}Fe_{0.4}$ is selected as the nanomagnet material, which is demonstrated to have a large magnetostrictive coefficient. Assuming the complete transfer of strain from the piezoelectric layer 107 to the nanomagnets 105a, the stress and the strain in the nanomagnet 105a are related by:

$$\sigma_i = Y\varepsilon_i (i \equiv xx, yy)$$

where Y being the Young's modulus of the magnetic material. The total energy of magnet with a perpendicular magnetic anisotropy, $H_k$ upon the application of a biaxial stress is given by:

$$E_{total} = E_{PMA} + E_{strain} = \frac{1}{2}\mu_0 M_s H_k \text{Sin}^2 \theta + E_{strain}$$

where $M_s$, $\mu_0$ and $\theta$ are the saturation magnetization of the magnet, the vacuum permeability and the angle of the magnetization with respect to the −z axis, respectively. The anisotropy field due to the stress is calculated using the following relation:

$$H_\sigma = \frac{\delta E_{strain}}{\delta \overline{m}}$$

The dynamics of free nanomagnets 105a is described by the modified Landau-Lifshitz-Gilbert equation, which is as follows:

$$\frac{\delta \overline{m}}{\delta t} = -\gamma \mu_0 [\overline{m} \times H_{eff}] + \alpha \left[\overline{m} \times \frac{\delta \overline{m}}{\delta t}\right] + \frac{I_p}{eN_s}$$

where, $\gamma$ is the electron gyromagnetic ratio, $\alpha$ is the Gilbert damping coefficient, $I_p$ is the component of the vector spin current perpendicular to the magnetization, $\overline{m}$ entering the nanomagnets, and $N_s$ is the total number of Bohr magnetons per magnet.

Here, the effective magnetic field is given as:

$$H_{eff} = H_\sigma + H_{PMA} + H_N$$

where $H_{PMA}$ and $H_N$ are the fields due to perpendicular magnetic anisotropy and stochastic noise, respectively. The noise field $H_N$ is expressed as:

$$H_N = H_i \hat{x} + H_j \hat{y} + H_k \hat{z}$$

which acts isotopically on the magnet and hence can be describe as:

$$\langle H_t(t) \rangle = 0$$

$$\langle H_l(t) H_k(t') \rangle = \frac{2\alpha k_B T}{\mu_0^2 \gamma M_s V} \delta(t-t')\delta_{lk}$$

where $k_B$ is the Boltzmann constant, T is the temperature and V is the volume of the nanomagnets 105a. In order for the initial conditions of the magnets to be randomized, the initial angle of the magnets follows the relationship:

$$\langle \theta^2 \rangle = \frac{k_B T}{M_s V \mu_0 H_{PMA}}$$

The magnetization dynamics of the nanomagnets can be simulated in the presence of a uniform bi-axial stress, $\sigma(=\sigma_{xx}=\sigma_{yy})$. In order to understand the steady state condition of the magnet under the effect of the uniform bi-axial stress, without an applied stress (i.e., $\sigma$=0), the total energy $E_{total}$ is the minimum along ±z-axis ($\theta$=0° and 180°). For a uniform bi-axial stress, $\sigma$, the stress energy can be written as:

$$E_{strain} = 3/2 \lambda \sigma \text{Cos}^2 \theta$$

Hence with the increase of the bi-axial stress, the anisotropy energy along the ±z-axis increases and above a critical stress, $\theta$=90° (the xy-plane) becomes the minimum energy plane. The critical stress is expressed as:

$$\sigma_c = \frac{\mu_0 M_s H_k}{3\lambda}$$

Assuming the continuity of strain at the interface between the nanomagnets 105a and the underlying piezoelectric 107, the voltage required across the piezoelectric layer 107 to generate the stress is given by:

$$V_{PZe} = \frac{\sigma_c}{\gamma d_{31}} d_{PZe}$$

where $d_{PZe}$ is the thickness of the piezoelectric layer 107. The critical bi-axial stress, $\sigma_c$ for this example is calculated to be −132 MPa which corresponds to voltage of 167 mV across the piezoelectric 107.

In one example, upon the application of a uniform bi-axial stress, $\sigma$=−200 MPa which corresponds to a=253 mV, with an initial direction of the magnetization is taken along the −z axis, the time required for the 90° rotation of the magnetization is approximately 10 ns and after 10 ns, the magnetization moves stochastically in the xy-plane.

Figure 5A:
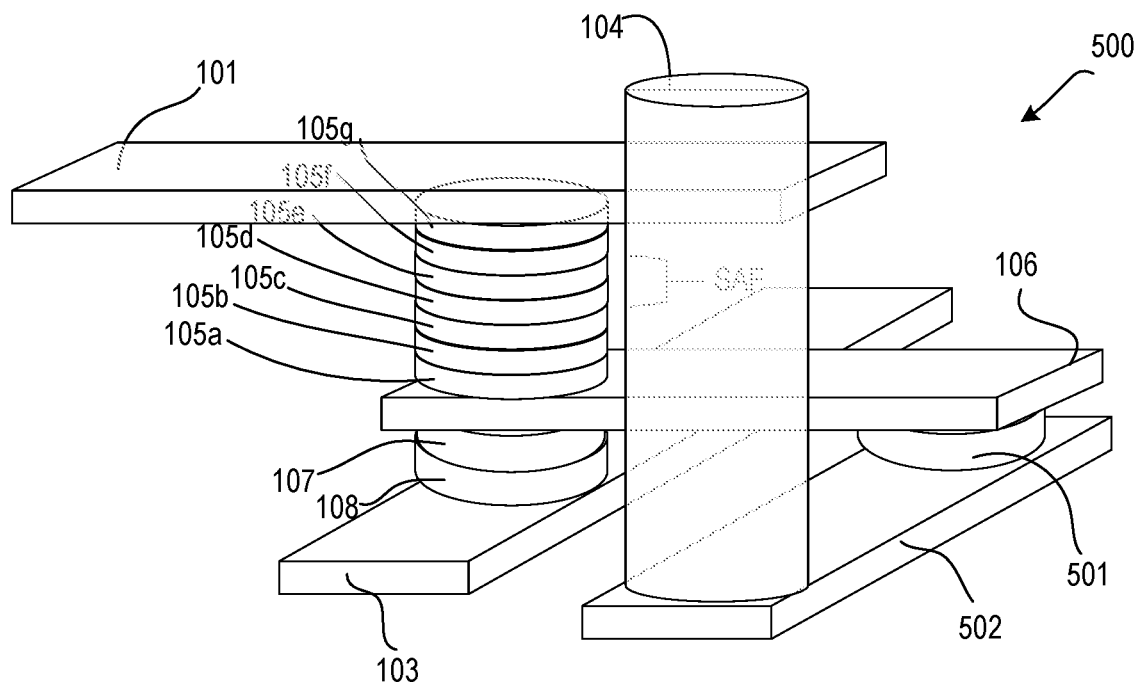
FIG. 5A illustrates a 3D view of a cross-point MRAM bit-cell, according to some embodiments of the disclosure.

FIG. 5A illustrates a 3D view of a cross-point MRAM bit-cell 500, according to some embodiments of the disclosure. It is pointed out that those elements of FIG. 5A having the same reference numbers (or names) as the elements of any other figure can operate or function in any manner similar to that described, but are not limited to such.

Figure 5B:
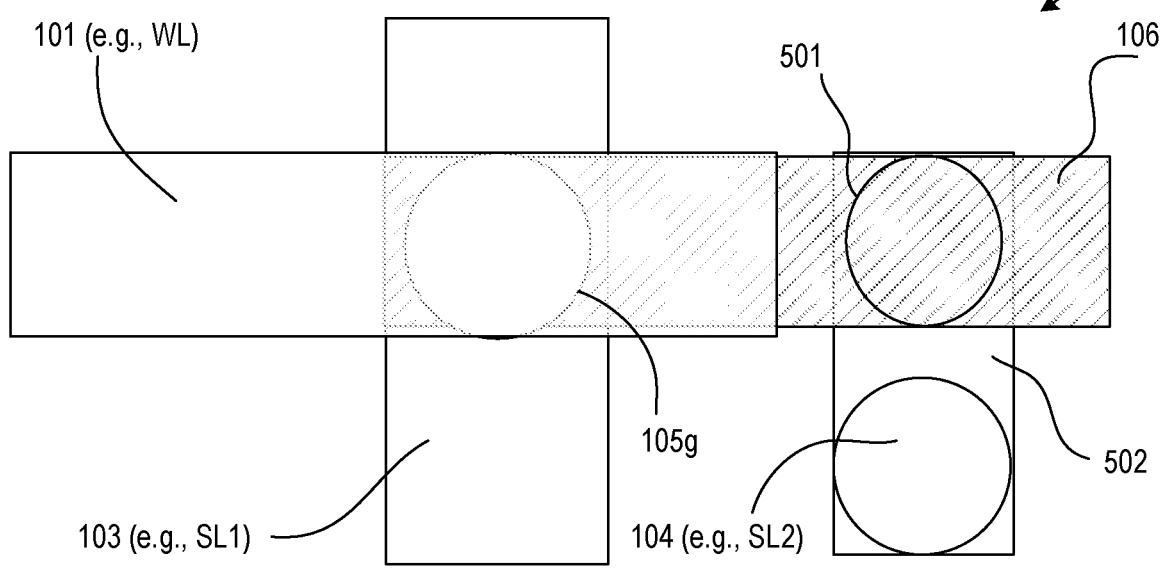
FIG. 5B illustrates a top view of 3D the cross-point MRAM bit-cell of FIG. 5A, according to some embodiments of the disclosure.

FIG. 5A is similar to FIG. 1 except that access to third interconnect 104 along the z-axis is via an L-shaped jog where layer 106 extends in the x-direction and then connects to interconnect 502 (e.g., metal silicides, Cu, Al, Co, etc.) extending in the y-direction through via 501 (e.g., metal silicides, Cu, Al, Co, etc.). In this example, first interconnect 101 extends along the x-axis, and second interconnect 103 extends along the y-axis. FIG. 5B illustrates top view 520 of 3D the cross-point MRAM bit-cell 500 of FIG. 5A, according to some embodiments of the disclosure. In some embodiments, first interconnect 101 functions as a word-line (WL), second interconnect 103 functions as a first select line (SL1), and third interconnect 104 functions as a second select line (SL2).

Figure 6A:
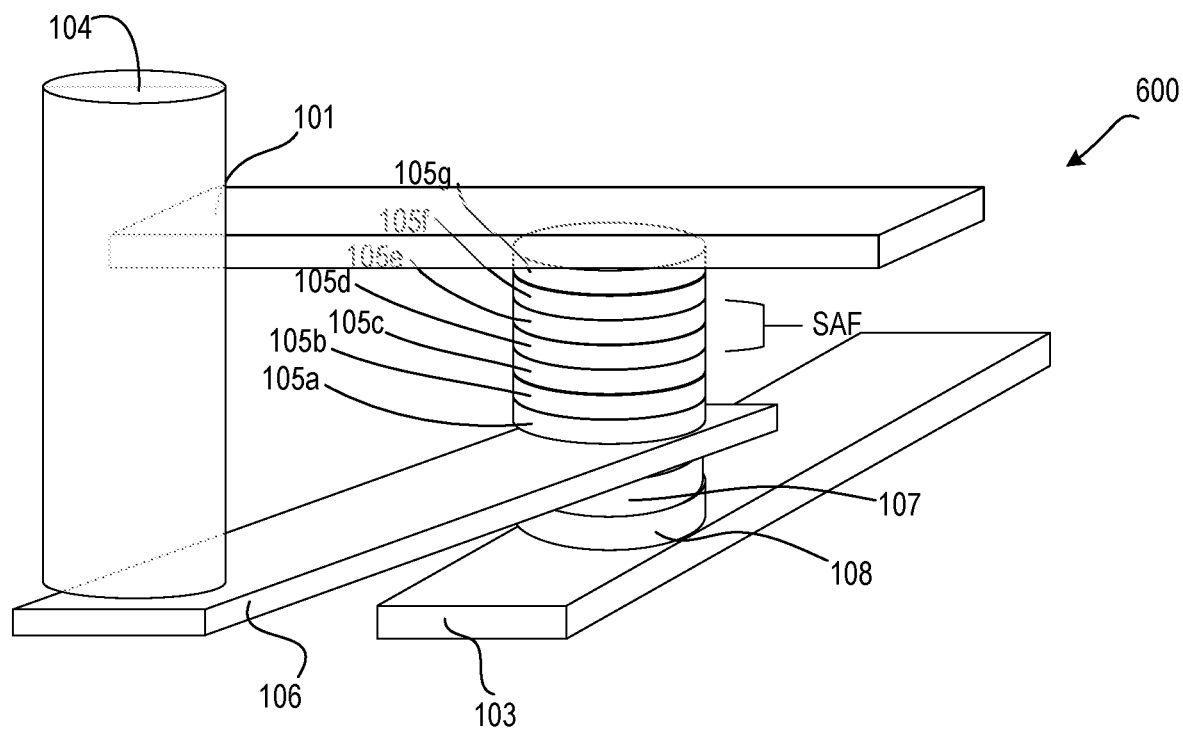
FIG. 6A illustrates a 3D view of a cross-point MRAM bit-cell, according to some embodiments of the disclosure.

FIG. 6A illustrates a 3D view 600 of a cross-point MRAM bit-cell, according to some embodiments of the disclosure. It is pointed out that those elements of FIG. 6A having the same reference numbers (or names) as the elements of any other figure can operate or function in any manner similar to that described, but are not limited to such.

Figure 6B:
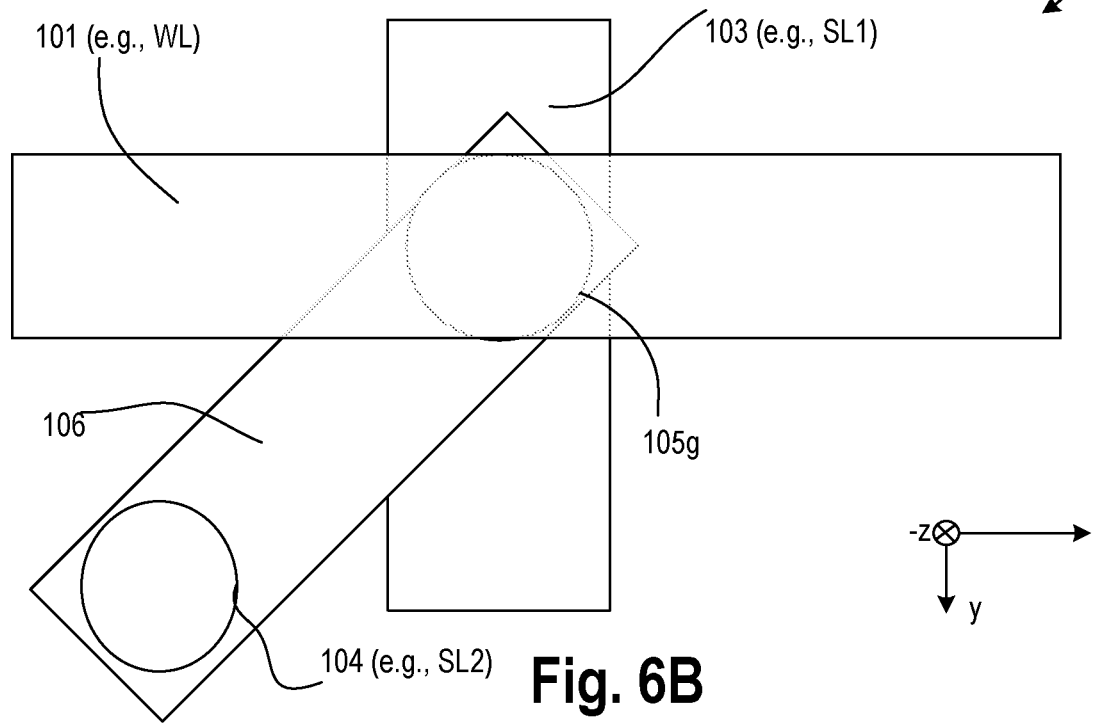
FIG. 6B illustrates a top view of 3D the cross-point MRAM bit-cell of FIG. 6A, according to some embodiments of the disclosure.

In some embodiments, the 3D cross-point bit-cell comprises of a bit-cell addressed via 3D intersection of the gridlines along x, y, and z directions. These directions can be permutated as required, in accordance with some embodiments. The dimensions of the bit-cells can be reduced by rotating one of the addressing lines at an angle (e.g., 45 degrees to the X axis). One such embodiment is illustrated by 3D view 600. Here, layer 106 is rotated at an angle (e.g., 45°) to the x-axis. Third interconnect 104 is then coupled to one end of layer 106. FIG. 6B illustrates top view 620 of 3D the cross-point MRAM bit-cell of FIG. 6A, according to some embodiments of the disclosure. The bit-cell size (e.g., pitch of the bit-cell along x, y, and z axis) of bit-cell 600 is smaller than bit-cell size of bit-cell 500 by rotating layer 106 at an angle (e.g., 45°) to the x-axis. As such, more memory can be packed in a smaller area.

Figure 7:
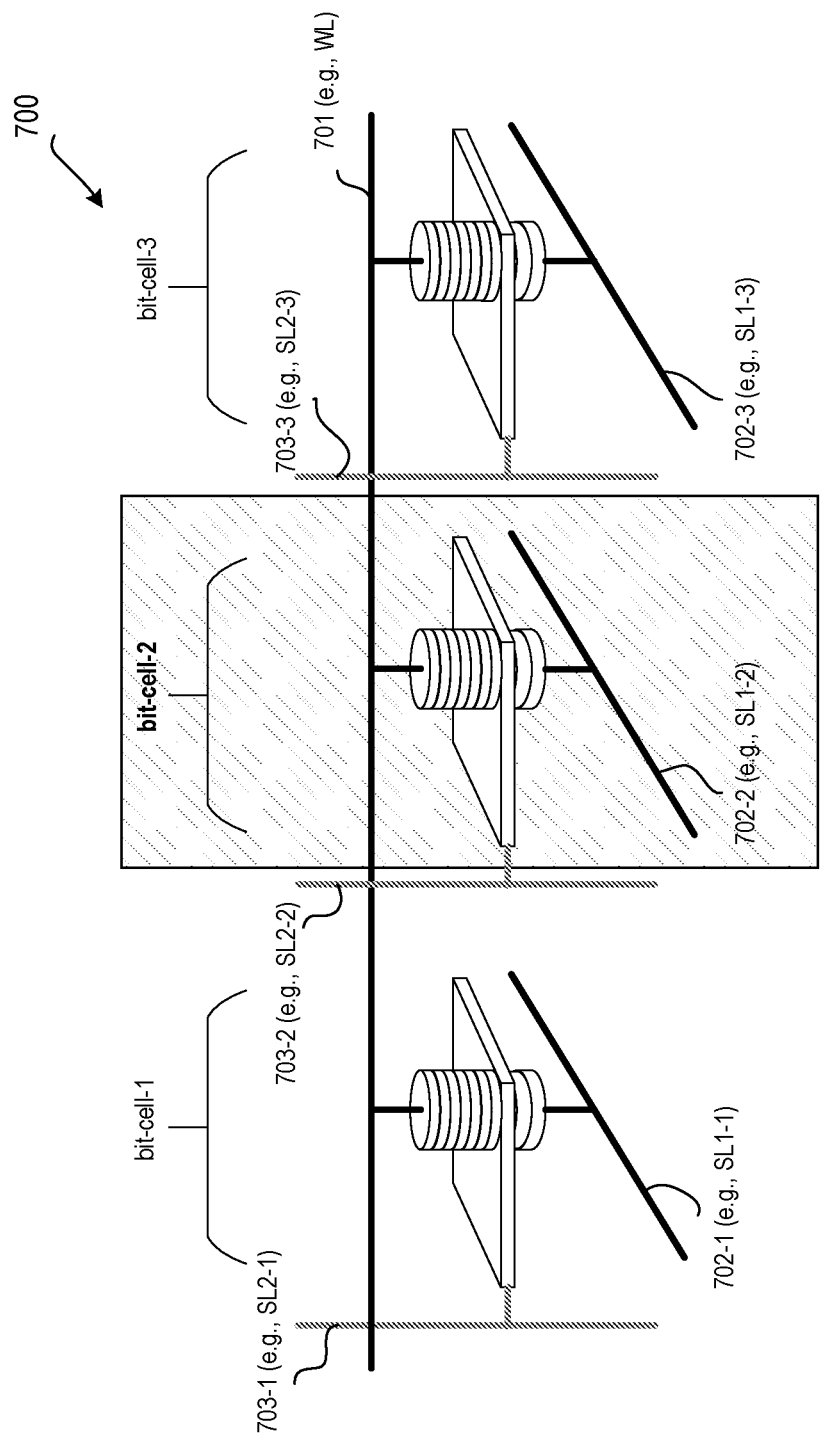
FIG. 7 illustrates a row of cross-point MRAM bit-cells along an x-axis where a bit-cell in the middle is selected for write operation, according to some embodiments of the disclosure.

FIG. 7 illustrates row 700 of cross-point MRAM bit-cells along an x-axis where a bit-cell in the middle is selected for write operation, according to some embodiments of the disclosure. It is pointed out that those elements of FIG. 7 having the same reference numbers (or names) as the elements of any other figure can operate or function in any manner similar to that described, but are not limited to such.

In this example, row 700 along the x-axis has three cross-point 3D MRAM bit-cells—bit-cell-1, bit-cell-2, and bit-cell-3. The bit-cells share a common WL as first interconnect 701 (same as first interconnect 101). Each bit-cell has its own select lines (SL) 1 and 2. For example, bit-cell-1 has SL1-1 interconnect 702-1 (same as second interconnect 103) and SL-2 interconnect 703-1 (same as third interconnect 104). Likewise, bit-cell-2 has SL1-2 interconnect 702-2 (same as second interconnect 103) and SL1-2 interconnect 703-2 (same as third interconnect 104), bit-cell-3 has SL1-3 interconnect 702-3 (same as second interconnect 103) and SL1-3 interconnect 703-3 (same as third interconnect 104).

When bit-cell-2 is selected (shown as shaded cell) for writing, SL1-2 is set high (e.g., power supply), SL2-2 is set low (e.g., ground), and WL is selected (e.g., set high), other bit-cells can be read using TMR. As such, read and write operations can be performed in parallel, in accordance with some embodiments. For the bit-cells that are being read from (e.g., bit-cell-1 and bit-cell-3), PZe layers 107 for those bit-cells are set to low (e.g., SL1-1 and SL1-3 are set to low). As such, any read operation does not cause disturbance to data written in those bit-cells.

Figure 8:
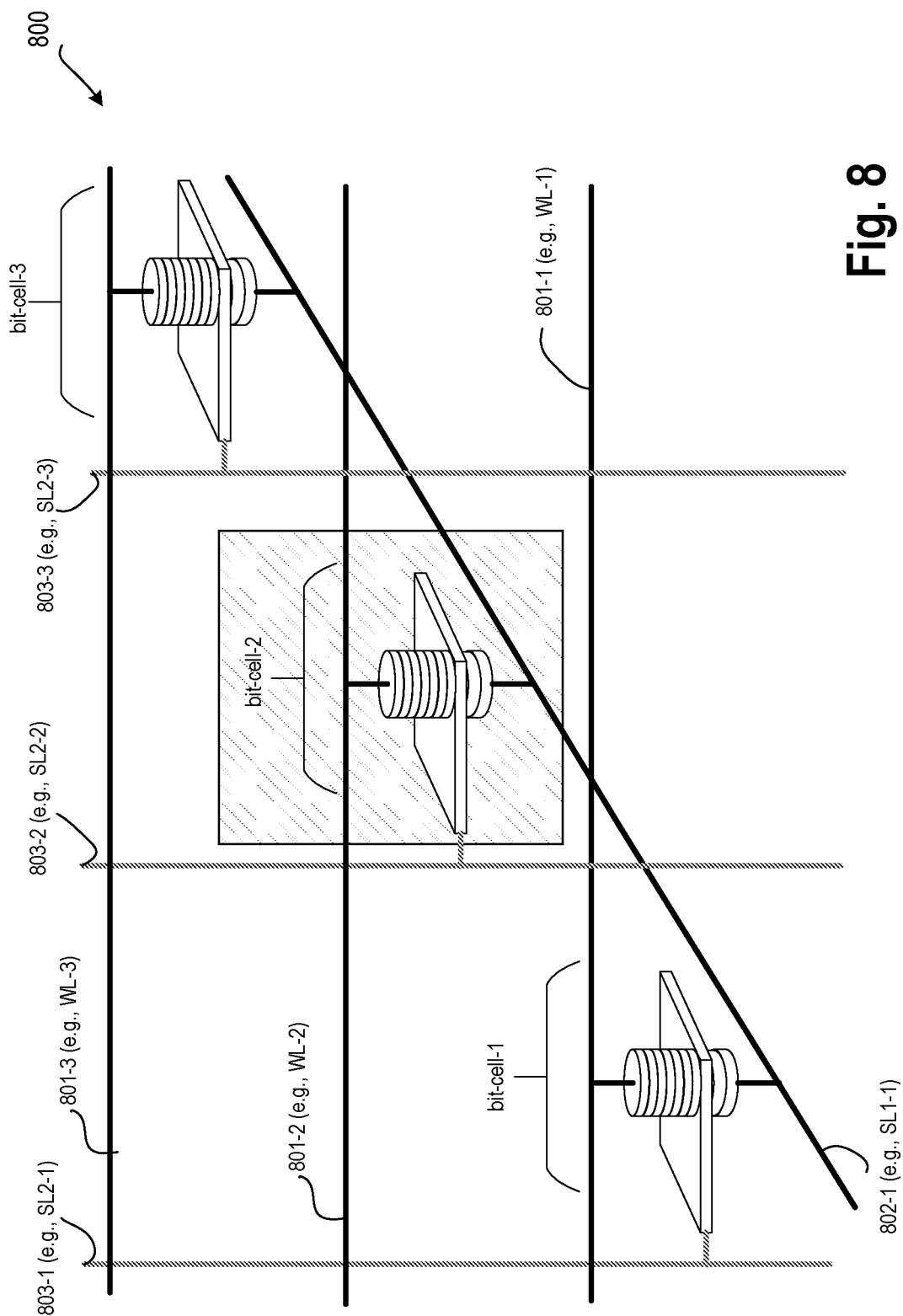
FIG. 8 illustrates a row of cross-point MRAM bit-cells along a y-axis where a bit-cell in the middle is selected for write operation, according to some embodiments of the disclosure.

FIG. 8 illustrates row 800 of cross-point MRAM bit-cells along a y-axis where a bit-cell in the middle is selected for write operation, according to some embodiments of the disclosure. It is pointed out that those elements of FIG. 8 having the same reference numbers (or names) as the elements of any other figure can operate or function in any manner similar to that described, but are not limited to such.

In this example, row 800 along the y-axis has three cross-point 3D MRAM bit-cells—bit-cell-1, bit-cell-2, and bit-cell-3. The bit-cells share a common select line SL1-1 as second interconnect 802-1 (same as second interconnect 103). Each bit-cell has its own wordline (WL) and second select line (SL2). For example, bit-cell-1 has SL2-1 interconnect 803-1 (same as third interconnect 104) and WL-1 interconnect 801-1 (same as first interconnect 101). Likewise, bit-cell-2 has SL2-2 interconnect 803-2 (same as third interconnect 104) and WL-2 interconnect 801-2 (same as first interconnect 101), and bit-cell-3 has SL2-3 interconnect 803-3 (same as third interconnect 104) and WL-3 interconnect 801-3 (same as first interconnect 101).

When bit-cell-2 is selected (shown as shaded cell), the bit-cells along row 800 may be disturbed. However, since the energy barrier of the un-selected bit-cells is high, any disturbance does not affect the data stored in those un-selected bit-cells. In some embodiments, when bit-cell-2 is being written to, other un-selected bit-cells in that row can be read from in parallel. As such, Y-row select operation can be performed where one bit-cell is selected for write operation while the peripheral bits are not written, and can be read from, in accordance with some embodiments.

Figure 9:
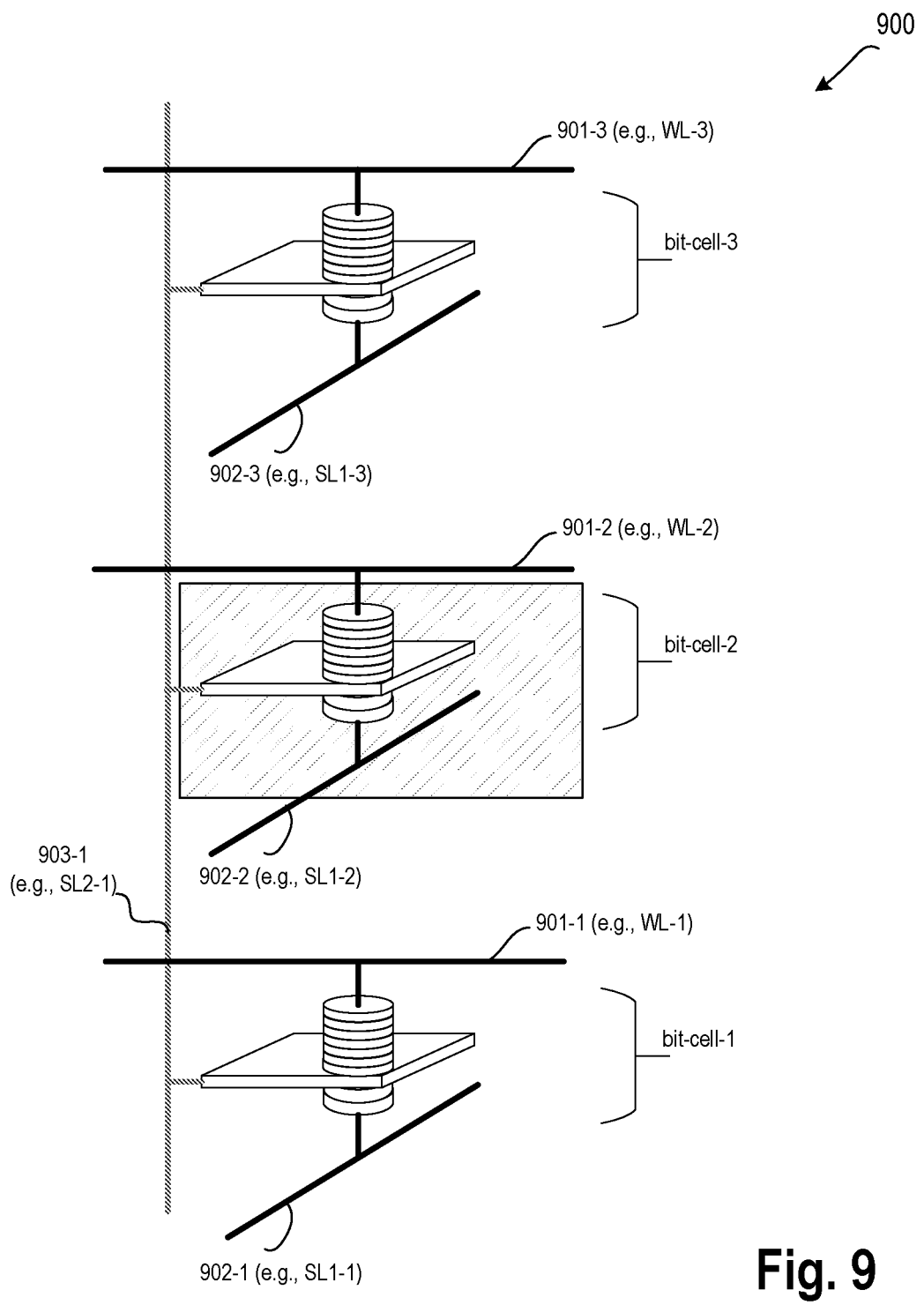
FIG. 9 illustrates a row of cross-point MRAM bit-cells along a z-axis where a bit-cell in the middle is selected for write operation, according to some embodiments of the disclosure.

FIG. 9 illustrates row 900 of cross-point MRAM bit-cells along a z-axis where a bit-cell in the middle is selected for write operation, according to some embodiments of the disclosure. It is pointed out that those elements of FIG. 9 having the same reference numbers (or names) as the elements of any other figure can operate or function in any manner similar to that described, but are not limited to such.

In this example, row 900 along the z-axis has three cross-point 3D MRAM bit-cells—bit-cell-1, bit-cell-2, and bit-cell-3. The bit-cells share a common select line SL2-1 as third interconnect 903-1 (same as third interconnect 104). Each bit-cell has its own wordline (WL) and first select line (SL1). For example, bit-cell-1 has SL1-1 interconnect 902-1 (same as second interconnect 103) and WL-1 interconnect 901-1 (same as first interconnect 101). Likewise, bit-cell-2 has SL1-3 interconnect 902-2 (same as second interconnect 103) and WL-2 interconnect 901-2 (same as first interconnect 101), and bit-cell-3 has SL1-3 interconnect 902-3 (same as second interconnect 103) and WL-3 interconnect 901-3 (same as first interconnect 101). The z-axis bit-cells are neither write or read disturbed and are available for parallel writing or reading, in accordance with some embodiments.

Figure 10:
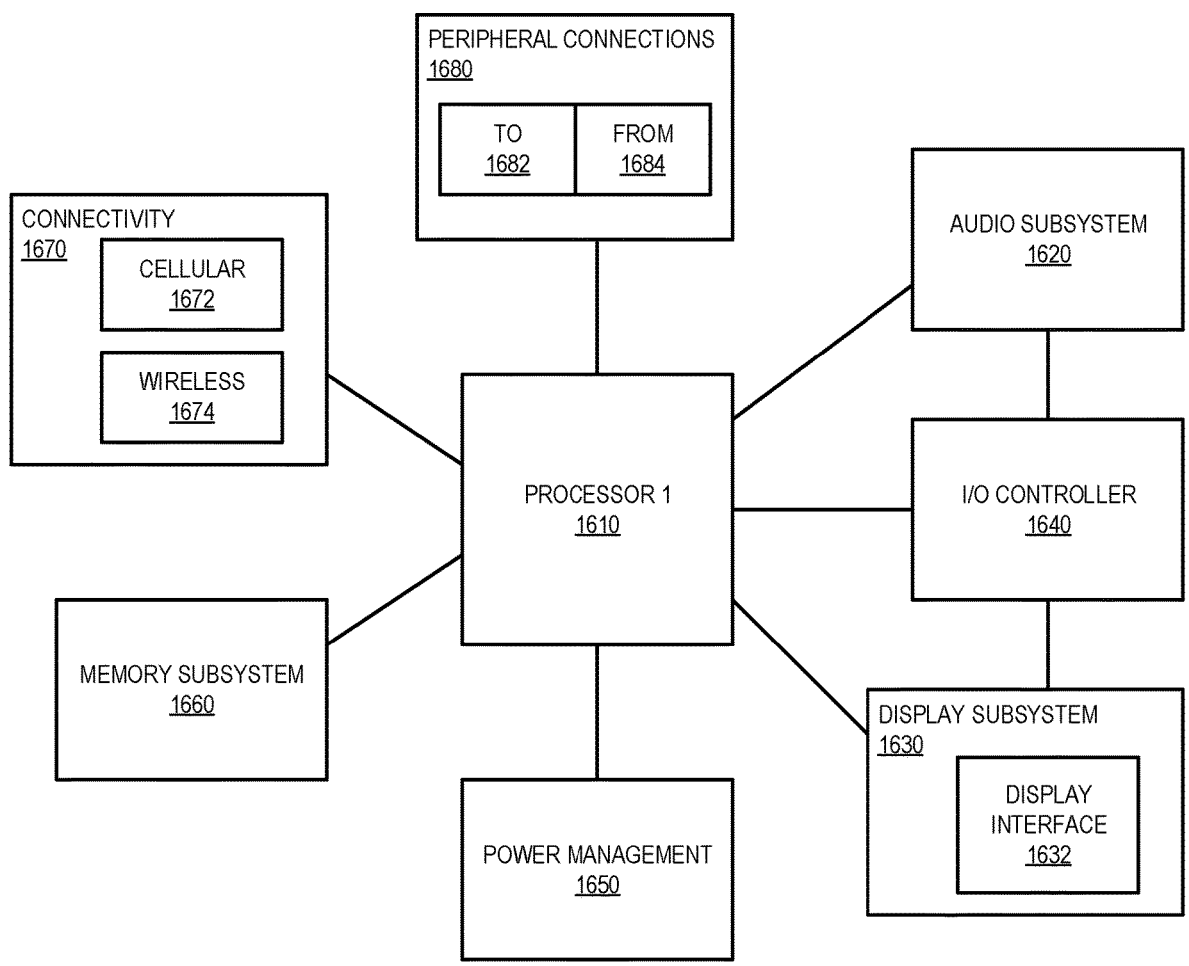
FIG. 10 illustrates a smart device or a computer system or a SoC (System-on-Chip) with 3D (three dimensional) cross-point MRAM, according to some embodiments of the disclosure.

FIG. 10 illustrates a smart device or a computer system or a SoC (System-on-Chip) with 3D cross-point MRAM, according to some embodiments of the disclosure. It is pointed out that those elements of FIG. 10 having the same reference numbers (or names) as the elements of any other figure can operate or function in any manner similar to that described, but are not limited to such.

FIG. 10 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

For purposes of the embodiments, the transistors in various circuits and logic blocks described here are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure.

In some embodiments, computing device 1600 includes first processor 1610 with 3D cross-point MRAM, according to some embodiments discussed. Other blocks of the computing device 1600 may also include a 3D cross-point MRAM, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a first interconnect extending along a first axis; a second interconnect extending along a second axis; a third interconnect extending along a third axis, wherein the first, second and third axes are orthogonal to one another; a magnetic junction device including a first electrode coupled to the first interconnect; a piezoelectric (PZe) layer adjacent to a second electrode, wherein the second electrode is coupled to the second interconnect; and a first layer adjacent to the PZe layer and the magnetic junction, wherein the first layer is coupled the third interconnect.

In some embodiments, the magnetic junction device is one of spin valve or magnetic tunneling junction (MTJ). In some embodiments, the magnetic junction device comprises: a free magnetic layer adjacent to the first layer; a fixed magnetic layer; and an intermediate layer adjacent to the free and fixed magnetic layers. In some embodiments, the apparatus comprises: a Synthetic Anti-Ferromagnet (SAF) layer adjacent to the fixed magnetic layer; and an anti-ferromagnet (AFM) layer adjacent to the SAF layer, wherein the AFM layer is coupled to the first electrode. In some embodiments, the free and fixed magnetic layers are in-plane magnets. In some embodiments, the free and fixed magnetic layers comprise materials selected from a group consisting of: Fe, Ni, Co and their alloys, magnetic insulators, and Heusler alloys of the form $X_2YZ$. In some embodiments, the Heusler alloys are selected from a group consisting of: $Co_2FeAl$ and $Co_2FeGeGa$ are used for forming 6-state magnet 107. Other examples of Heusler alloys include: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Fe_2Val$, $Mn_2VGa$, and $Co_2FeGe$. In some embodiments, the free magnetic layer has perpendicular magnetic anisotropy (PMA), and wherein the fixed magnetic layer is an in-plane magnet. In some embodiments, the free magnetic layer with PMA comprises a stack of materials, and wherein the materials for the stack are selected from a group consisting of: Co and Pt; Co and Pd; Co and Ni; MgO, CoFeB, Ta, CoFeB, and MgO; MgO, CoFeB, W, CoFeB, and MgO; MgO, CoFeB, V, CoFeB, and MgO; MgO, CoFeB, Mo, CoFeB, and MgO; $Mn_xGa_y$. In some embodiments, the free magnetic layer with PMA comprises a single layer of one or more materials. In some embodiments, the single layer comprises a material selected from a group consisting of: MnGa, MnGe, and MnGaGe. In some embodiments, the intermediate layer is a metal layer which makes the magnetic junction a spin valve, or wherein the intermediate layer is a dielectric layer which makes the magnetic junction a magnetic tunneling junction (MTJ). In some embodiments, the first layer comprises a material selected from a group consisting of: Ru, Ta, and W.

In some embodiments, the PZe layer comprises a material selected from a group consisting of: Barium titanate ($BaTiO_3$), Lead zirconate titanate (PZT), Potassium niobate ($KNbO_3$), Sodium tungstate ($Na_2WO_3$), $Ba_2NaNb_5O_5$, $Pb_2KNb_5O_{15}$, Zinc oxide (ZnO)-Wurtzite structure, Sodium potassium niobate ($(K,Na)NbO_3$) (or NKN), Bismuth ferrite ($BiFeO_3$), Sodium niobate $NaNbO_3$, Bismuth titanate $Bi_4Ti_3O_{12}$, Sodium bismuth titanate $Na_{0.5}Bi_{0.5}TiO_3$, Group III-V and II-VI materials, Polyvinylidene fluoride (PVDF), and diphenylalanine peptide nanotubes (PNTs). In some embodiments, the first, second, and third interconnects comprises non-magnetic metals. In some embodiments, the first, second and third axes are x, y, and z axis respectively. In some embodiments, the PZe layer is operable to reduce a thermal barrier of the magnetic junction during a write operation.

In another example, a system is provided which comprises: a memory; a processor coupled to the memory, the processor including an apparatus according to the apparatus described above; and a wireless interface for allowing the processor to communicate with another device.

In another example, an apparatus is provided which comprises: a three dimensional (3D) array of magnetic random access memory (MRAM) bit-cells, wherein the array includes a mesh of: a first interconnect extending along a first axis; a second interconnect extending along a second axis; and a third interconnect extending along a third axis, wherein the first, second and third axes are orthogonal to one another, and wherein a bit-cell of the MRAM bit-cells includes: a magnetic junction device including a first electrode coupled to the first interconnect; a piezoelectric (PZe) layer adjacent to a second electrode, wherein the second electrode is coupled to the second interconnect; and a first layer adjacent to the PZe layer and the magnetic junction, wherein the first layer is coupled the third interconnect. In some embodiments, the magnetic junction device is one of spin valve or magnetic tunneling junction (MTJ). In some embodiments, the magnetic junction device comprises: a free magnetic layer adjacent to the first layer; a fixed magnetic layer; and an intermediate layer adjacent to the free and fixed magnetic layers. In some embodiments, the apparatus comprises: a Synthetic Anti-Ferromagnet (SAF) layer adjacent to the fixed magnetic layer; and an anti-ferromagnet (AFM) layer adjacent to the SAF layer, wherein the AFM layer is coupled to the first electrode. In some embodiments, the free and fixed magnetic layers are in-plane magnets. In some embodiments, the free and fixed magnetic layers comprise materials selected from a group consisting of: Fe, Ni, Co and their alloys, magnetic insulators, and Heusler alloys of the form $X_2YZ$. In some embodiments, the Heusler alloys are selected from a group consisting of: $Co_2FeAl$ and $Co_2FeGeGa$ are used for forming 6-state magnet 107. Other examples of Heusler alloys include: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Fe_2Val$, $Mn_2VGa$, and $Co_2FeGe$. In some embodiments, the free magnetic layer has perpendicular magnetic anisotropy (PMA), and wherein the fixed magnetic layer is an in-plane magnet.

In some embodiments, the free magnetic layer with PMA comprises a stack of materials, and wherein the materials for the stack are selected from a group consisting of: Co and Pt; Co and Pd; Co and Ni; MgO, CoFeB, Ta, CoFeB, and MgO; MgO, CoFeB, W, CoFeB, and MgO; MgO, CoFeB, V, CoFeB, and MgO; MgO, CoFeB, Mo, CoFeB, and MgO; $Mn_xGa_y$. In some embodiments, the free magnetic layer with PMA comprises a single layer of one or more materials. In some embodiments, the single layer comprises a material selected from a group consisting of: MnGa, MnGe, and MnGaGe. In some embodiments, the intermediate layer is a metal layer which makes the magnetic junction a spin valve, or wherein the intermediate layer is a dielectric layer which makes the magnetic junction a magnetic tunneling junction (MTJ). In some embodiments, the first layer comprises a material selected from a group consisting of: Ru, Ta, and W.

In some embodiments, the PZe layer comprises a material selected from a group consisting of: Barium titanate ($BaTiO_3$), Lead zirconate titanate (PZT), Potassium niobate ($KNbO_3$), Sodium tungstate ($Na_2WO_3$), $Ba_2NaNb_5O_5$, $Pb_2KNb_5O_{15}$, Zinc oxide (ZnO)-Wurtzite structure, Sodium potassium niobate ($(K,Na)NbO_3$) (or NKN), Bismuth ferrite ($BiFeO_3$), Sodium niobate $NaNbO_3$, Bismuth titanate $Bi_4Ti_3O_{12}$, Sodium bismuth titanate $Na_{0.5}Bi_{0.5}TiO_3$, Group III-V and II-VI materials, Polyvinylidene fluoride (PVDF), and diphenylalanine peptide nanotubes (PNTs). In some embodiments, the first, second, and third interconnects comprises non-magnetic metals. In some embodiments, the first, second and third axes are x, y, and z axis respectively. In some embodiments, the PZe layer is operable to reduce a thermal barrier of the magnetic junction during a write operation.

In another example, a system is provided which comprises: a memory; a processor coupled to the memory, the processor including an apparatus according to the apparatus described above; and a wireless interface for allowing the processor to communicate with another device.

In another example, a method is provided which comprises: extending a first interconnect along a first axis; extending a second interconnect along a second axis; extending a third interconnect along a third axis, wherein the first, second and third axes are orthogonal to one another; forming a magnetic junction device including a first electrode coupled to the first interconnect; depositing a piezoelectric (PZe) layer adjacent to a second electrode, wherein the second electrode is coupled to the second interconnect; and depositing a first layer adjacent to the PZe layer and the magnetic junction, wherein the first layer is coupled the third interconnect. In some embodiments, the magnetic junction device is one of spin valve or magnetic tunneling junction (MTJ). In some embodiments, wherein the forming magnetic junction device comprises: depositing a free magnetic layer adjacent to the first layer; depositing a fixed magnetic layer; and depositing an intermediate layer adjacent to the free and fixed magnetic layers. In some embodiments, the method comprises: depositing a Synthetic Anti-Ferromagnet (SAF) layer adjacent to the fixed magnetic layer; and depositing an anti-ferromagnet (AFM) layer adjacent to the SAF layer, wherein the AFM layer is coupled to the first electrode. In some embodiments, the free and fixed magnetic layers are in-plane magnets. In some embodiments, the free and fixed magnetic layers comprises materials selected from a group consisting of: Fe, Ni, Co and their alloys, magnetic insulators, and Heusler alloys of the form $X_2YZ$. In some embodiments, the Heusler alloys are selected from a group consisting of: $Co_2FeAl$ and $Co_2FeGeGa$ are used for forming 6-state magnet 107. Other examples of Heusler alloys include: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Fe_2VaI$, $Mn_2VGa$, and $Co_2FeGe$.

In some embodiments, the free magnetic layer has perpendicular magnetic anisotropy (PMA), and wherein the fixed magnetic layer is an in-plane magnet. In some embodiments, the free magnetic layer with PMA comprises a stack of materials, and wherein the materials for the stack are selected from a group consisting of: Co and Pt; Co and Pd; Co and Ni; MgO, CoFeB, Ta, CoFeB, and MgO; MgO, CoFeB, W, CoFeB, and MgO; MgO, CoFeB, V, CoFeB, and MgO; MgO, CoFeB, Mo, CoFeB, and MgO; $Mn_xGa_y$. In some embodiments, the free magnetic layer with PMA comprises a single layer of one or more materials. In some embodiments, the single layer comprises a material selected from a group consisting of: MnGa, MnGe, and MnGaGe. In some embodiments, the intermediate layer is a metal layer which makes the magnetic junction a spin valve, or wherein the intermediate layer is a dielectric layer which makes the magnetic junction a magnetic tunneling junction (MTJ). In some embodiments, the first layer comprises a material selected from a group consisting of: Ru, Ta, and W. In some embodiments, the PZe layer comprises a material selected from a group consisting of: Barium titanate ($BaTiO_3$), Lead zirconate titanate (PZT), Potassium niobate ($KNbO_3$), Sodium tungstate ($Na_2WO_3$), $Ba_2NaNb_5O_5$, $Pb_2KNb_5O_{15}$, Zinc oxide (ZnO)-Wurtzite structure, Sodium potassium niobate ($(K,Na)NbO_3$) (or NKN), Bismuth ferrite ($BiFeO_3$), Sodium niobate $NaNbO_3$, Bismuth titanate $Bi_4Ti_3O_{12}$, Sodium bismuth titanate $Na_{0.5}Bi_{0.5}TiO_3$, Group III-V and II-VI materials, Polyvinylidene fluoride (PVDF), and diphenylalanine peptide nanotubes (PNTs). In some embodiments, the first, second, and third interconnects comprise of non-magnetic metals. In some embodiments, the first, second and third axes are x, y, and z axis respectively. In some embodiments, the PZe layer is operable to reduce a thermal barrier of the magnetic junction during a write operation.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a first interconnect extending along a first axis;
   a second interconnect extending along a second axis;
   a third interconnect extending along a third axis, wherein the first, second and third axes are orthogonal to one another; and
   a magnetic junction device including a first electrode coupled to the first interconnect;
   a first layer comprising piezoelectric (PZe) material, wherein the first layer is adjacent to a second electrode, wherein the second electrode is coupled to the second interconnect; and
   a second layer adjacent to the first layer and the magnetic junction device, wherein the second layer is coupled to the third interconnect.

2. The apparatus of claim 1, wherein the magnetic junction device is one of spin valve or magnetic tunneling junction (MTJ).

3. The apparatus of claim 1, wherein the magnetic junction device comprises:
   a third layer comprising a free magnet, wherein the third layer is adjacent to the second layer;
   a fourth layer comprising a fixed magnet; and
   a fifth layer adjacent to the third and fourth layers.

4. The apparatus of claim 3 further comprising:
   a sixth layer comprising a Synthetic Anti-Ferromagnet (SAF), wherein the sixth layer is adjacent to the fourth layer; and
   a seventh layer comprising an anti-ferromagnet (AFM), wherein the seventh layer is adjacent to the sixth layer, wherein the seventh layer is coupled to the first electrode.

5. The apparatus of claim 3, wherein the free and fixed magnets are in-plane magnets.

6. The apparatus of claim 5, wherein the free and fixed magnets comprise materials including one or more of: Fe, Ni, Co and their alloys, magnetic insulators, or Heusler alloys of the form $X_2YZ$.

7. The apparatus of claim 6, wherein the Heusler alloys include one or more of: Co, Fe, Al, Ge, Ga, Cu, Mn, In, Sn, Ni, Sb, Pd, or V.

8. The apparatus of claim 3, wherein the free magnet has perpendicular magnetic anisotropy (PMA), and wherein the fixed magnet is an in-plane magnet.

9. The apparatus of claim 8, wherein the third layer comprises a stack of materials, and wherein the materials for the stack are selected from a group consisting of: Co and Pt; Co and Pd; Co and Ni; MgO, CoFeB, Ta, CoFeB, and MgO; MgO, CoFeB, W, CoFeB, and MgO; MgO, CoFeB, V, CoFeB, and MgO; MgO, CoFeB, Mo, CoFeB, and MgO; and $Mn_xGa_y$.

10. The apparatus of claim 8, wherein the third layer comprises a single layer of one or more materials.

11. The apparatus of claim 10, wherein the single layer comprises a material including one or more of: Mn, Ga, and Ge.

12. The apparatus of claim 3, wherein the fifth layer comprises metal which makes the magnetic junction device a spin valve, or wherein the fifth layer comprises a dielectric which makes the magnetic junction device a magnetic tunneling junction (MTJ).

13. The apparatus of claim 1, wherein the second layer comprises a material including one or more of: Ru, Ta, and W.

14. The apparatus of claim 1, wherein the PZe material includes one or more of: Ba, Ti, O, L, Nb, Na, W, Na, Zn, Bi, Fe, and F.

15. The apparatus of claim 1, wherein the first, second, and third interconnects comprise non-magnetic metals.

16. The apparatus of claim 1, wherein the first, second and third axes are x, y, and z axes, respectively.

17. The apparatus of claim 1, wherein the first layer is operable to reduce a thermal barrier of the magnetic junction device during a write operation.

18. A system comprising:
- a memory;
- a processor coupled to the memory, the processor including an apparatus which comprises:
  - a first interconnect extending along a first axis;
  - a second interconnect extending along a second axis;
  - a third interconnect extending along a third axis, wherein the first, second and third axes are orthogonal to one another;
  - a magnetic junction device including a first electrode coupled to the first interconnect;
  - a piezoelectric (PZe) layer adjacent to a second electrode, wherein the second electrode is coupled to the second interconnect; and
  - a first layer adjacent to the PZe layer and the magnetic junction device, wherein the first layer is coupled to the third interconnect; and
- a wireless interface to allow the processor to communicate with another device.

19. The system of claim 18, wherein the first layer comprises a material selected from a group consisting of: Ru, Ta, and W.

20. The system of claim 18, wherein the PZe layer comprises a material selected from a group consisting of: Barium titanate (BaTiO$_3$), Lead zirconate titanate (PZT), Potassium niobate (KNbO$_3$), Sodium tungstate (Na$_2$WO$_3$), Ba$_2$NaNb$_5$O$_5$, Pb$_2$KNb$_5$O$_{15}$, Zinc oxide (ZnO)-Wurtzite structure, Sodium potassium niobate ((K,Na)NbO$_3$) (or NKN), Bismuth ferrite (BiFeO$_3$), Sodium niobate NaNbO$_3$, Bismuth titanate Bi$_4$Ti$_3$O$_{12}$, Sodium bismuth titanate Na$_{0.5}$Bi$_{0.5}$TiO$_3$, Group III-V and II-VI materials, Polyvinylidene fluoride (PVDF), and diphenylalanine peptide nanotubes (PNTs).

21. An apparatus comprising:
- a three dimensional (3D) array of magnetic random access memory (MRAM) bit-cells, wherein the array includes a mesh of:
  - a first interconnect extending along a first axis;
  - a second interconnect extending along a second axis; and
  - a third interconnect extending along a third axis, wherein the first, second and third axes are orthogonal to one another, and
- wherein a bit-cell of the MRAM bit-cells includes:
  - a magnetic junction device including a first electrode coupled to the first interconnect;
  - a piezoelectric (PZe) layer adjacent to a second electrode, wherein the second electrode is coupled to the second interconnect; and
  - a first layer adjacent to the PZe layer and the magnetic junction device, wherein the first layer is coupled to the third interconnect.

22. The apparatus of claim 21, wherein the first layer comprises a material selected from a group consisting of: Ru, Ta, and W.

23. The apparatus of claim 21, wherein the PZe layer comprises a material selected from a group consisting of: Barium titanate (BaTiO$_3$), Lead zirconate titanate (PZT), Potassium niobate (KNbO$_3$), Sodium tungstate (Na$_2$WO3), Ba$_2$NaNb$_5$O$_5$, Pb$_2$KNb$_5$O$_{15}$, Zinc oxide (ZnO)-Wurtzite structure, Sodium potassium niobate ((K,Na)NbO$_3$) (or NKN), Bismuth ferrite (BiFeO$_3$), Sodium niobate NaNbO$_3$, Bismuth titanate Bi$_4$Ti$_3$O$_{12}$, Sodium bismuth titanate Na$_{0.5}$Bi$_{0.5}$TiO$_3$, Group III-V and II-VI materials, Polyvinylidene fluoride (PVDF), and diphenylalanine peptide nanotubes (PNTs).

* * * * *